United States Patent
Liu et al.

(10) Patent No.: US 9,553,161 B2
(45) Date of Patent: Jan. 24, 2017

(54) MECHANISM FOR FORMING METAL GATE STRUCTURE

(71) Applicant: Taiwan Semiconductor Manufacturing Co., Ltd., Hsin-Chu (TW)

(72) Inventors: Chi-Jen Liu, Taipei (TW); Li-Chieh Wu, Hsinchu (TW); Shich-Chang Suen, Hsinchu (TW); Liang-Guang Chen, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 14/746,061

(22) Filed: Jun. 22, 2015

(65) Prior Publication Data

US 2015/0295063 A1 Oct. 15, 2015

Related U.S. Application Data

(62) Division of application No. 13/917,145, filed on Jun. 13, 2013, now Pat. No. 9,076,766.

(51) Int. Cl.

| H01L 21/8234 | (2006.01) |
| H01L 29/51 | (2006.01) |
| H01L 29/423 | (2006.01) |
| H01L 29/49 | (2006.01) |
| H01L 21/8238 | (2006.01) |
| H01L 29/66 | (2006.01) |
| H01L 29/78 | (2006.01) |
| H01L 21/02 | (2006.01) |

(Continued)

(52) U.S. Cl.
CPC ....... *H01L 29/517* (2013.01); *H01L 21/02068* (2013.01); *H01L 21/02096* (2013.01); *H01L 21/02244* (2013.01); *H01L 21/28079* (2013.01); *H01L 21/28088* (2013.01); *H01L 21/28229* (2013.01); *H01L 21/28518* (2013.01); *H01L 21/3212* (2013.01); *H01L 21/82345* (2013.01); *H01L 21/823456* (2013.01); *H01L 21/823842* (2013.01); *H01L 29/401* (2013.01); *H01L 29/42376* (2013.01); *H01L 29/4966* (2013.01); *H01L 29/66545* (2013.01); *H01L 29/7833* (2013.01); *H01L 29/7843* (2013.01)

(58) Field of Classification Search
CPC .................. H01L 21/82345; H01L 21/823842; H01L 21/823456; H01L 21/82385
See application file for complete search history.

(56) References Cited

U.S. PATENT DOCUMENTS 5,990,555 A * 11/1999 Ohori ................... G02F 1/13454
257/381
6,099,662 A * 8/2000 Wang ................. H01L 21/02065
134/26

(Continued)

*Primary Examiner* — Phat X Cao
(74) *Attorney, Agent, or Firm* — Birch, Stewart, Kolasch & Birch, LLP

(57) ABSTRACT

A method for forming a semiconductor device is provided. The method includes providing a semiconductor substrate and forming a metal gate stack including a metal gate electrode over the semiconductor substrate. The method also includes applying an oxidizing solution containing an oxidizing agent over the metal gate electrode to oxidize the metal gate electrode to form a metal oxide layer on the metal gate electrode.

20 Claims, 8 Drawing Sheets

(51) Int. Cl.
*H01L 21/28* (2006.01)
*H01L 21/285* (2006.01)
*H01L 21/321* (2006.01)
*H01L 29/40* (2006.01)

(56) References Cited

U.S. PATENT DOCUMENTS

| | | |
|---|---|---|
| 2012/0273902 A1 | 11/2012 | Lin et al. |
| 2013/0009241 A1* | 1/2013 | Matsuda ........... H01L 29/42372 |
| | | 257/331 |
| 2013/0056837 A1 | 3/2013 | Ng et al. |
| 2014/0159239 A1* | 6/2014 | Bossler ............... H01L 23/5384 |
| | | 257/741 |

* cited by examiner

MECHANISM FOR FORMING METAL GATE STRUCTURE

CROSS REFERENCE

This application is a Divisional of U.S. application Ser. No. 13/917,145, filed on Jun. 13, 2013 and entitled "Mechanisms for forming metal gate structure".

BACKGROUND

The semiconductor integrated circuit (IC) industry has experienced rapid growth. Technological advances in IC materials and design have produced generations of ICs. Each generation has smaller and more complex circuits than the previous generation. However, these advances have increased the complexity of processing and manufacturing ICs.

In the course of IC evolution, functional density (i.e., the number of interconnected devices per chip area) has generally increased while geometric size (i.e., the smallest component (or line) that can be created using a fabrication process) has decreased. This scaling down process generally provides benefits by increasing production efficiency and lowering associated costs.

However, since the feature sizes continue to decrease, fabrication processes continue to become more difficult to perform. Thus, it is a challenge to form reliable semiconductor devices with smaller and smaller sizes.

BRIEF DESCRIPTION OF THE DRAWINGS

For a more complete understanding of the embodiments, and the advantages thereof, reference is now made to the following descriptions taken in conjunction with the accompany drawings, in which.

DETAILED DESCRIPTION OF THE ILLUSTRATIVE EMBODIMENTS

The making and using of the embodiments of the disclosure are discussed in detail below. It should be appreciated, however, that the embodiments can be embodied in a wide variety of specific contexts. The specific embodiments discussed are merely illustrative, and do not limit the scope of the disclosure.

It is to be understood that the following disclosure provides many different embodiments, or examples, for implementing different features of the disclosure. Specific examples of components and arrangements are described below to simplify the present disclosure. These are, of course, merely examples and are not intended to be limiting. Moreover, the performance of a first process before a second process in the description that follows may include embodiments in which the second process is performed immediately after the first process, and may also include embodiments in which additional processes may be performed between the first and second processes. Various features may be arbitrarily drawn in different scales for the sake of simplicity and clarity. Furthermore, the formation of a first feature over or on a second feature in the description that follows include embodiments in which the first and second features are formed in direct contact, and may also include embodiments in which additional features may be formed between the first and second features, such that the first and second features may not be in direct contact. Throughout the various views and illustrative embodiments, like reference numbers are used to designate like elements.

Figure 1A:
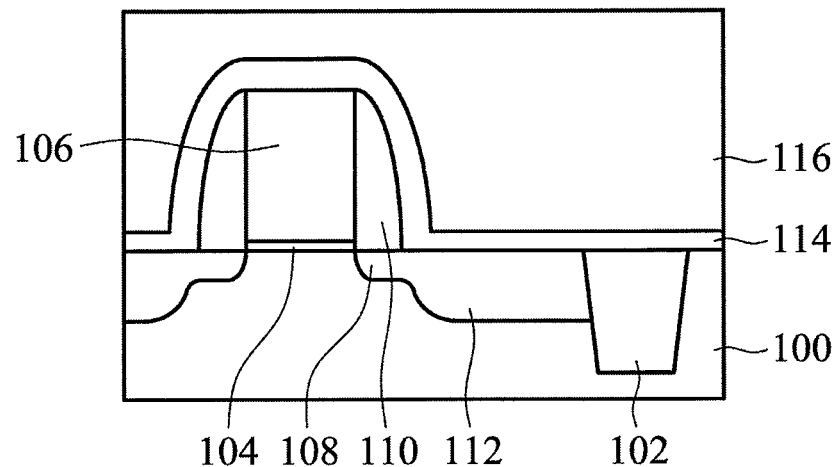
FIGS. 1A-1G are cross-sectional views of intermediate stages in the manufacturing of a semiconductor device, in accordance with some embodiments.

FIGS. 1A-1G are cross-sectional views of intermediate stages in the manufacturing of a semiconductor device, in accordance with some embodiments. Referring to FIG. 1A, a semiconductor substrate 100 is provided. The semiconductor substrate 100 may be a semiconductor wafer (such as a silicon wafer) or a portion of a semiconductor wafer. In some embodiments, the semiconductor substrate 100 is made of an elementary semiconductor material including silicon or germanium in a single crystal, polycrystal, or amorphous structure. In some other embodiments, the semiconductor substrate 100 is made of a compound semiconductor, such as silicon carbide, gallium arsenide, gallium phosphide, indium phosphide, indium arsenide, an alloy semiconductor, such as SiGe, GaAsP, AlInAs, AlGaAs, GaInAs, GaInP, GaInAsP, and/or combinations thereof. The semiconductor substrate 100 may also include multi-layer semiconductors, semiconductor on insulator (SOI) (such as silicon on insulator or germanium on insulator), and/or combinations thereof.

An isolation structure 102 is formed in the semiconductor substrate 100 to define various active regions in the semiconductor substrate 100, and to electrically isolate neighboring devices (e.g. transistors) from one another. The isolation structure 102 may be formed by using an isolation technology, such as local oxidation of semiconductor (LOCOS), shallow trench isolation (STI), or the like. The isolation structure 102 may be made of a dielectric material, such as silicon oxide, silicon nitride, silicon oxynitride, fluoride-doped silicate glass (FSG), a low-K dielectric material, other suitable materials, and/or combinations thereof. In some embodiments, the formation of the isolation structure 102 includes patterning the semiconductor substrate 100 by a photolithography process, etching a trench in the semiconductor substrate 100 (for example, by using a dry etching, wet etching, plasma etching process, and/or combinations thereof), and filling the trench (for example, by using a chemical vapor deposition process) with the dielectric material. In some embodiments, the filled trench may have a multi-layer structure, such as a thermal oxide liner layer filled with silicon nitride or silicon oxide. However, in some embodiments, the isolation structure 102 is optional.

As shown in FIG. 1A, a dummy gate 106 and a gate dielectric layer 104 are formed over the semiconductor substrate 100 for defining active regions in the semiconductor substrate 100. A gate-last approach or replacement-gate (RPG) approach will be subsequently performed to form a metal gate. The dummy gate 106 may be made of polysilicon. The gate dielectric layer 104 may serve as a dummy gate dielectric layer and is removed in a subsequent process operation. The gate dielectric layer 104 may be made of silicon oxide. However, in some other embodiments, the gate dielectric layer 104 does not serve as a dummy gate dielectric layer and will not be subsequently removed. In this case, the gate dielectric layer 104 may be made of silicon oxide, silicon oxynitride, a high dielectric constant material (high-k material), and/or combinations thereof.

As shown in FIG. 1A, spacers 110 are formed over sidewalls of the dummy gate 106. The spacers 110 may be made of a dielectric material, such as silicon nitride layer, silicon oxynitride layer, or combinations thereof. The structure of the spacers 110 shown in FIG. 1A is merely an example. Other configurations of the spacers 110 are also possible. For example, a sealing layer (not shown) is formed between the spacers 110 and the dummy gate 106. Doped regions 108 and 112 may be formed in the semiconductor substrate 100 by using a suitable process, such as an ion implantation process. The doped region 108 may be a lightly doped source and drain (LDD) region, which may be formed before the spacers 110 are formed. The doped region 112 may be a heavily doped source and drain (S/D) region, which may be formed after the spacers 110 are formed.

A contact etch stop layer 114 is formed over the semiconductor substrate 100 and the dummy gate 106. The contact etch stop layer 114 may also serve as a stressor layer, which may increase the carrier mobility in a channel region in the semiconductor substrate 100. The contact etch stop layer 114 may be made of a dielectric material, such as silicon nitride. The contact etch stop layer 114 may be conformally formed over the spacers 110, the dummy gate 106, and the semiconductor substrate 100. However, in some embodiments, the contact etch stop layer 114 is not needed.

As shown in FIG. 1A, an insulating layer 116 is then deposited over the dummy gate 106 and the semiconductor substrate 100. The insulating layer 116 may be made of any suitable insulating material, such as silicon oxide, silicon oxynitride, borosilicate glass (BSG), phosphoric silicate glass (PSG), borophosphosilicate glass (BPSG), fluorinated silicate glass (FSG), low-k material, porous dielectric material, and/or combinations thereof. The insulating layer 116 may be deposited by any suitable process, such as a CVD process, HDPCVD process, spin-on process, sputtering process, and/or combinations thereof.

Figure 1B:
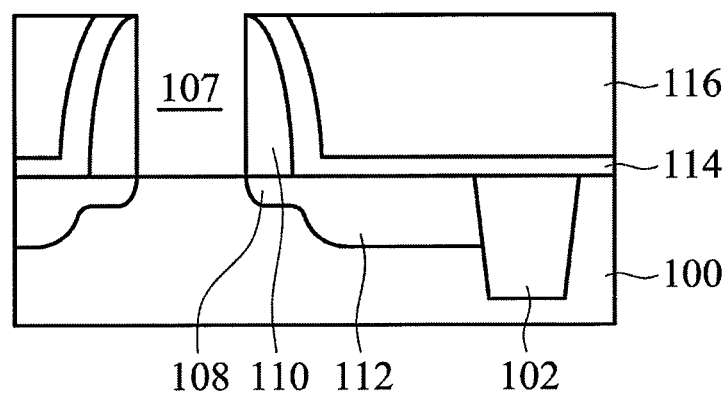

Next, as shown in FIG. 1B, a planarization process, such as a chemical mechanical polishing (CMP) or the like, is then performed to the insulating layer 116 until a top surface of the dummy gate 106 is exposed. After the planarization process is performed, the insulating layer 116 may have a substantially planar surface to facilitate subsequent process steps.

Then, the dummy gate 106 is removed by using a suitable process, such as a wet etching process, a dry etching process, or combinations thereof. In some embodiments, the gate dielectric layer 104 is also removed. After the dummy gate 106 and the gate dielectric layer 104 are removed, an opening 107 is thus formed between the spacers 110. The opening 107 may be a trench.

Figure 1C:
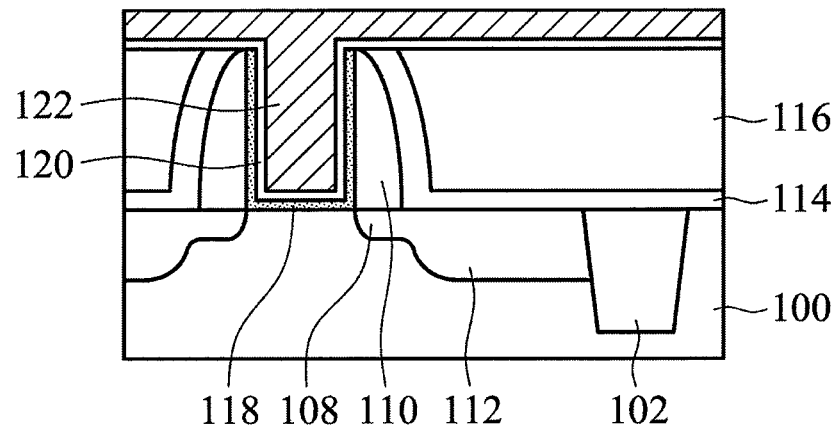

As shown in FIG. 1C, a gate dielectric layer 118 is formed to cover sidewalls and a bottom of the opening 107, in accordance with some embodiments. In some embodiments, the gate dielectric layer 118 is formed over the bottom of the opening 107 without extending over the sidewalls of the opening 107. The gate dielectric layer 118 may be made of a dielectric material, such as a high dielectric constant (high-k) material. The high-k material may include hafnium oxide ($HfO_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), other suitable high-k dielectric materials, and/or combinations thereof. The high-k material may further include metal oxides, metal nitrides, metal silicates, transition metal-oxides, transition metal-nitrides, transition metal-silicates, oxynitrides of metals, metal aluminates, zirconium silicate, zirconium aluminate, silicon oxide, silicon nitride, silicon oxynitride, zirconium oxide, titanium oxide, aluminum oxide, hafnium dioxide-alumina ($HfO_2$—$Al_2O_3$) alloy, other suitable materials, and/or combinations thereof.

The gate dielectric layer 118 may be deposited by any suitable process, such as atomic layer deposition (ALD), chemical vapor deposition (CVD), physical vapor deposition (PVD), remote plasma CVD (RPCVD), plasma enhanced CVD (PECVD), metal organic CVD (MOCVD), sputtering, plating, other suitable processes, and/or combinations thereof. In some embodiments, the gate dielectric layer 118 needs to be further annealed.

An intermediate dielectric layer (not shown) may be formed over the semiconductor substrate 100 before the gate dielectric layer 118 is formed. The intermediate dielectric layer may be made of a suitable dielectric material, such as silicon oxide, hafnium silicate, silicon oxynitride, and/or combinations thereof. In some embodiments, the intermediate dielectric layer is a native oxide layer grown over the semiconductor substrate 100.

As shown in FIG. 1C, a work function metal layer 120 is deposited over the insulating layer 116 and the gate dielectric layer 118 in the opening 107, in accordance with some embodiments. The work function metal layer 120 provides desired work function for transistors to enhance device performance including improved threshold voltage. In the embodiments of forming an NMOS transistor, the work function metal layer 120 can be an n-type metal capable of providing a work function value suitable for the device, such as equal to or less than about 4.5 eV. The n-type metal may include metal, metal carbide, metal nitride, or combinations thereof. For example, the n-type metal includes tantalum, tantalum nitride, or combinations thereof. On the other hand, in the embodiments of forming a PMOS transistor, the work function metal layer 120 can be a p-type metal capable of providing a work function value suitable for the device, such as equal to or greater than about 4.8 eV. The p-type metal may include metal, metal carbide, metal nitride, other suitable materials, or combinations thereof. For example, the p-type metal includes titanium, titanium nitride, other suitable materials, or combinations thereof.

The work function metal layer 120 may also be made of hafnium, zirconium, titanium, tantalum, aluminum, metal carbides (e.g., hafnium carbide, zirconium carbide, titanium carbide, aluminum carbide), aluminides, ruthenium, palladium, platinum, cobalt, nickel, conductive metal oxides, and/or combinations thereof. The work function metal layer 120 may be deposited by using a PVD process, CVD process, ALD process, plating process, another suitable method, and/or combinations thereof.

A gate electrode layer 122 is then deposited over the semiconductor substrate 100 and the work function metal layer 120 to fill the opening 107. The gate electrode layer 122 may be made of a suitable metal material, such as aluminum, tungsten, gold, platinum, cobalt, other suitable metal, alloy thereof, and/or combinations thereof. The gate electrode layer 122 may be deposited by using a PVD process, CVD process, plating process, the like, and/or combinations thereof.

Figure 1D:
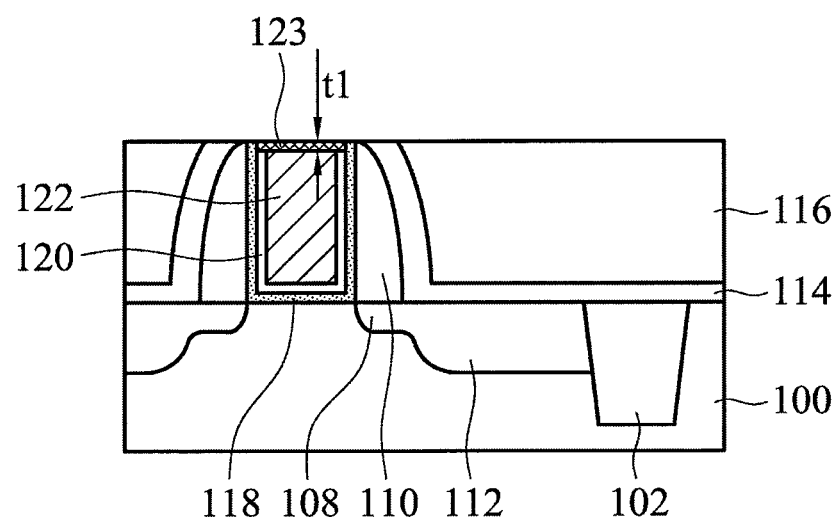

Next, a planarization process, such as a chemical mechanical polishing (CMP) process or the like, is performed to remove the gate electrode layer 122 and the work function metal layer 120 outside of the opening 107, as shown in FIG. 1D. The gate electrode layer 122, the work function metal layer 120, and the gate dielectric layer 118 together form a gate stack (i.e., a metal gate stack), which is surrounded by the insulating layer 116. The gate electrode layer 122 may serve as a metal gate electrode of the gate stack.

After the CMP process is completed, residues may be left over the exposed surfaces of the insulating layer 116, the gate electrode layer 122, and the work function metal layer 120. The residues may come from slurry used during the CMP process and/or the removed work function metal layer 120 and the gate electrode layer 122 formed outside of the opening 107. The residues may be organic residues, metal containing residues, and/or metal ion containing residues. There may be some scratches formed at the exposed surfaces of the insulating layer 116, the gate electrode layer 122, and the work function metal layer 120. The residues and scratches could cause negative impact to create defect issue, particle issue, and/or short circuiting issue in subsequent processes.

Figure 2A:
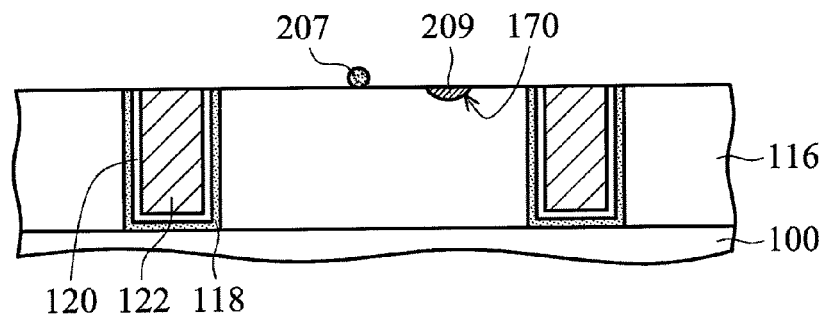
FIG. 2A is a cross-sectional view showing a semiconductor device, in accordance with some embodiments.

For example, FIG. 2A is a cross-sectional view showing a semiconductor device. In some embodiments, metal containing residues 209 and/or organic residues 207 are left over the exposed surface, such as the surface of the insulating layer 116. Scratches 170 may also be formed on the gate electrode layer 122 and/or the insulating layer 116, which may cause defect issue and/or particle issue. The metal containing residues 209 and the organic residues 207 may be formed on the surface of the insulating layer 116 or in the scratches 170. Due to the metal containing residues 209, a short circuiting problem might occur between adjacent gate stacks. Because of the existence of the metal containing residues 209, the organic residues 207, and/or the scratches 170, adhesion of the exposed surface of the structure shown in FIG. 2A and a subsequently formed layer is negatively affected.

Referring back to FIG. 1D, a metal oxide layer 123 is natively (spontaneously) grown on the exposed metal surface of the gate stack. As mentioned above, the gate stack may include the gate dielectric layer 118, the work function metal layer 120, and the gate electrode layer 122. For example, the metal oxide layer 123 is naturally grown on the gate electrode layer 122 and the work function metal layer 120 when they are exposed to air. In some embodiments, the gate electrode layer 122 is an aluminum gate electrode, and the metal oxide layer 123 includes an aluminum oxide layer. A thickness t1 of the metal oxide layer 123 may be in a range from about 15 Å to about 40 Å.

Due to the residues, the scratches, and/or other compounds left on the exposed metal surface of the gate stack, the metal oxide layer 123 (native) has an unclean surface and poor quality. As a result, due to the unclean surface and the poor quality of the metal oxide layer 123, adhesion between the metal oxide layer 123 and a subsequently formed layer, such as a stop layer made of a nitride material (e.g., silicon nitride), is poor. The poor interfacial adhesion between the metal oxide layer 123 and the subsequently formed layer also negatively affects neighboring interface.

Etchants are used in subsequent contact formation and metal salicidation process. The poor interfacial adhesion would allow etchants used in these operations to diffuse through the poor interface to come in contact with and damage the gate electrode layer 122. The etchants could cause interfacial delamination, and also the gate electrode layer 122 could be removed. Such delamination and lost of the gate electrode layer 122 would reduce yield.

Figure 1E:
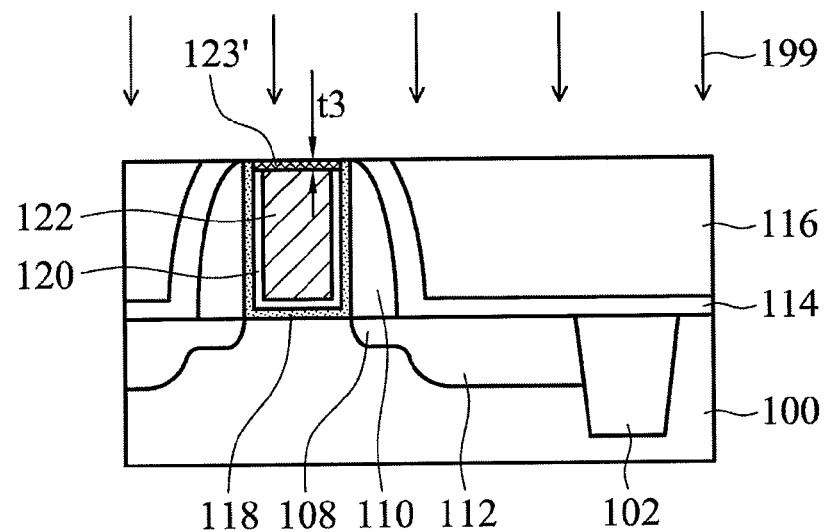

To resolve the problems described above, a wet oxidation process 199 is adopted to form a dense metal oxide layer 123' on the exposed metal surface of the gate stack, as shown in FIG. 1E. In the wet oxidation process 199, an oxidizing solution is applied over the exposed gate stack to oxidize the exposed metal surface of the gate stack to form the dense metal oxide layer 123'. The oxidizing solution contains an oxidizing agent. The oxidizing agent assists in forming the dense metal oxide layer 123'. The un-oxidized metal material in and/or below the metal oxide layer 123 may be oxidized during the wet oxidation process 199. The dense metal oxide layer 123' may have an improved quality. The dense metal oxide layer 123' may thus have a strong adhesion with a subsequently formed layer. Due to the strong adhesion, the etchants are prevented from diffusing through the interface between the dense metal oxide layer 123' and the subsequently formed layer, and the interface would not be delaminated.

A thickness t3 of the dense metal oxide layer 123' may be in a range from about 15 Å to about 40 Å. The thickness t3 of the dense metal oxide layer 123' may be in the same thickness range of the metal oxide layer 123. In some embodiments, the dense metal oxide layer 123' formed is not too thick, which benefits the subsequent process for forming of a gate contact.

In some other embodiments, an oxidation process, such as an oxygen plasma process or annealing process in oxygen containing gas, is used to form an oxide layer on the gate electrode layer 122. If the annealing process is used, the annealing temperature depends on the materials used for the gate electrode layer 122 and the work function metal layer 120. However, such oxidation process utilizing the oxygen plasma process or annealing process could produce the oxide layer that is too thick. The oxide layer could be difficult to be removed during the contact etch process.

Any oxidizing agent capable of oxidizing the gate electrode layer 122 and transforming the metal oxide layer 123 to be the dense metal oxide layer 123' may be used. For example, the oxidizing agent may be made of $H_2O_2$, HClO, $NH_2OH$, $HMoO_4$, HIO3, $ClO_2$, and/or combinations thereof. The concentration of the oxidizing agent in the oxidizing solution may be in a range from about 0.0001% to about 35%. The pH value of the oxidizing solution may be in a range from about 3 to about 10. It should be appreciated that the concentration and/or the pH value of the oxidizing solution may be adjusted according to requirements. In some other embodiments, another oxidizing agent, such as $KFe(CN)_6$, $Fe(NO_3)_3$, $KIO_3$, the like, and/or combinations thereof, is used. The oxidizing agent may include any combination of the above mentioned oxidizing agents. The oxidizing solution may be applied on the exposed gate stack to form the dense metal oxide layer 123' by using a variety of methods, which are described in more detail later.

Figure 2B:
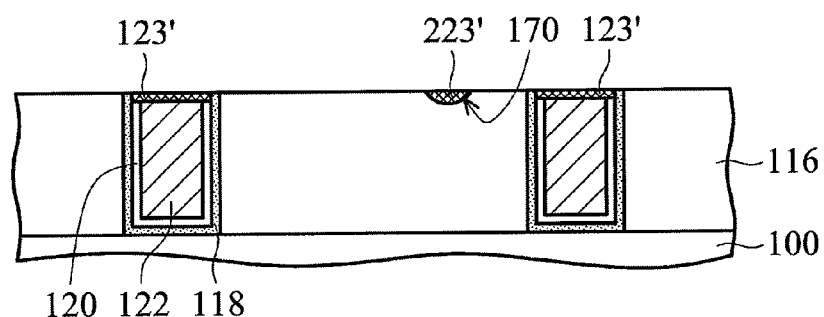
FIG. 2B is a cross-sectional view of the structure shown in FIG. 2A after being oxidized by an oxidizing solution.

The oxidizing solution also oxidizes the post planarization surface. For example, FIG. 2B is a cross-sectional view of the structure shown in FIG. 2A after being oxidized by the oxidizing solution. The oxidizing solution may be applied on the exposed surface of the gate stack and the insulating layer 116 to oxidize the exposed metal surface of the gate stack and the residues over the gate stack and the insulating layer 116. Thus, the oxidized residues are now easier to be removed.

For example, the organic residues 207 shown in FIG. 2A are oxidized, and are easily removed by cleaning, as shown in FIG. 2B. Further, the metal residues 209 in the scratch 170 are also oxidized to become a metal oxide material 223'. The metal oxide material 223' is either non-conductive or much less conductive. Therefore, the risk of short circuiting due to the metal residues 209 is greatly reduced. As mentioned above, the material of the metal oxide material 223' is similar to that of the dense metal oxide layer 123'. Thus, adhesion between the oxidized surface (including the surfaces of the insulating layer 116, the contact etch stop layer 114, the gate dielectric layer 118, the work function metal layer 120, and the gate electrode layer 122) and a subsequently formed layer, such as a nitride layer, is better than untreated surface which could have residues. In some embodiments, the dense metal oxide layer 123' extends across the gate stack.

Figure 1F:
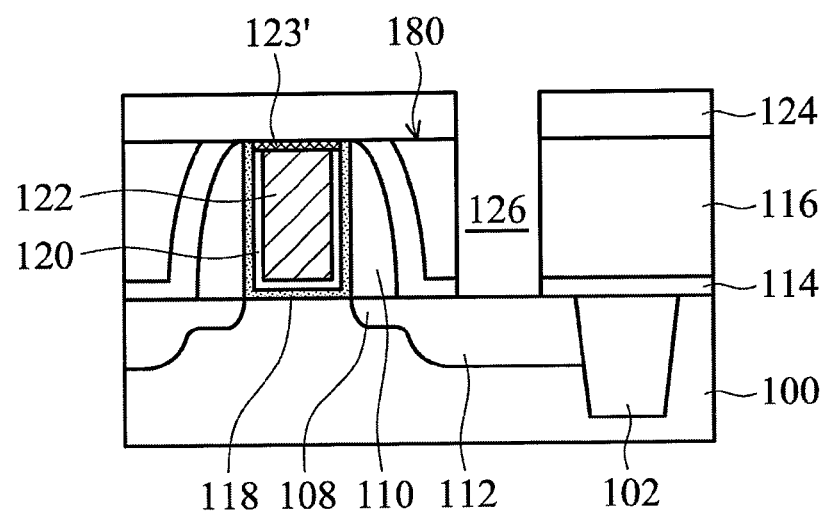

As shown in FIG. 1F, a stop layer 124 (also called an insulating layer or a dielectric layer) is deposited over the exposed surfaces of the insulating layer 116, the contact etch stop layer 114, and the dense metal oxide layer 123'. As mentioned above, different from the metal oxide layer 123, the dense metal oxide layer 123' has an improved quality. Because the exposed surfaces of the insulating layer 116, the contact etch stop layer 114, and the dense metal oxide layer 123' have been oxidized by the oxidizing solution, the residues, the scratches, and/or the metal oxide layer 123 mentioned above are now removed and/or turned into a denser oxide layer, such as the dense metal oxide layer 123'. Thus, adhesion between the stop layer 124 and the dense metal oxide layer 123', as well as the neighboring layers, is strong. The stop layer 124 formed is now in direct contact with a cleaner and oxidized surface. An interface 180 between the stop layer 124 and the various underlying layers has a significantly improved quality.

Afterwards, the stop layer 124 and the insulating layer 116 may be etched during separate etching processes to form a contact opening 126 exposing the doped region 112. In some embodiments, the stop layer 124 directly contacts with the entire top surface of the dense metal oxide layer 123'. Thus, due to the good adhesion between the stop layer 124 and the underlying layers, no interfacial delamination would occur. The strong interface 180 may prevent the etchant used for forming the contact opening 126 from diffusing through to contact with and damage the gate electrode layer 122. The gate electrode layer 122 covered by the dense metal oxide layer 123' may be prevented from being removed.

Figure 1G:
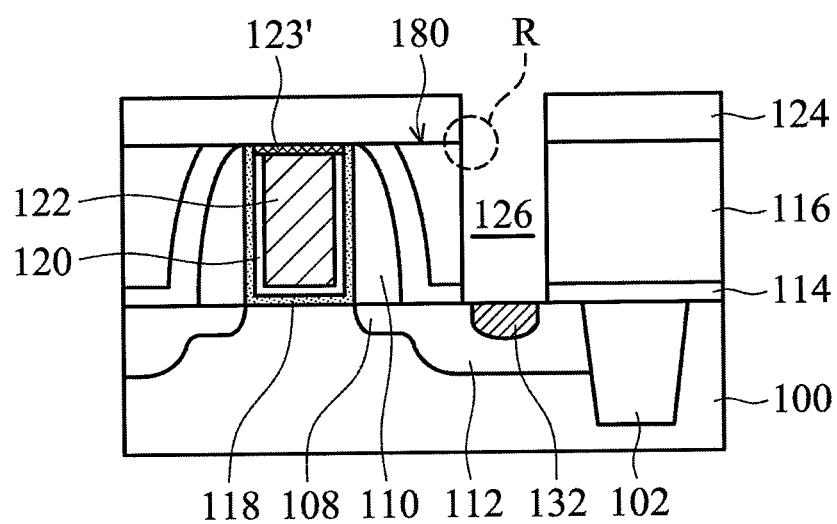

Next, as shown in FIG. 1G, a salicidation (self-aligned silicidation) process is performed to form a metal silicide region 132 on/in the doped region 112 (such as an S/D region), in accordance with some embodiments. The material of the metal silicide region 132 may include nickel silicide. In some embodiments, the metal silicide region 132 includes a silicide material of a suitable metal material. The suitable metal material may include cobalt (Co), nickel (Ni), platinum (Pt), titanium (Ti), ytterbium (Yb), molybdenum (Mo), erbium (Er), and/or combinations thereof.

Then, an un-reacted portion of a deposited metal film for forming the metal silicide region 132 is removed by using, for example, an etching process. The etching process may include a wet etching process, dry etching process, and/or combinations thereof. In some embodiments, a wet etching process is adopted to remove the un-reacted metal film. An etchant, such as hot phosphoric acid, is chosen to remove the un-reacted portion of the metal film.

In some embodiments, because the metal silicide region 132 is formed after the gate stack including the gate electrode layer 122, the quality of the metal silicide region 132 is not negatively affected by the annealing process for forming the gate stack, such as the annealing process of the gate dielectric layer 118. In other words, the metal silicide region 132 does not undergo too many annealing processes.

The quality and reliability of the metal silicide region 132 is maintained. In some embodiments, the salicidation process is optional.

As shown in FIG. 1G, because the adhesion between the stop layer 124 and the dense metal oxide layer 123' is good and the interface 180 is strong, an etchant capable of removing metal materials, such as that used during the salicidation process, may not penetrate from a region R, which is near an intersection of a sidewall of the contact opening 126 and the interface 180, to damage the gate electrode layer 122.

As mentioned above, the oxidizing solution containing the oxidizing agent may be applied on the exposed gate stack to form the dense metal oxide layer 123' by using a variety of methods. In some embodiments, the oxidizing solution is applied in-situ on the exposed surface of the gate stack during a CMP process for forming the gate electrode layer 122.

Figure 3A:
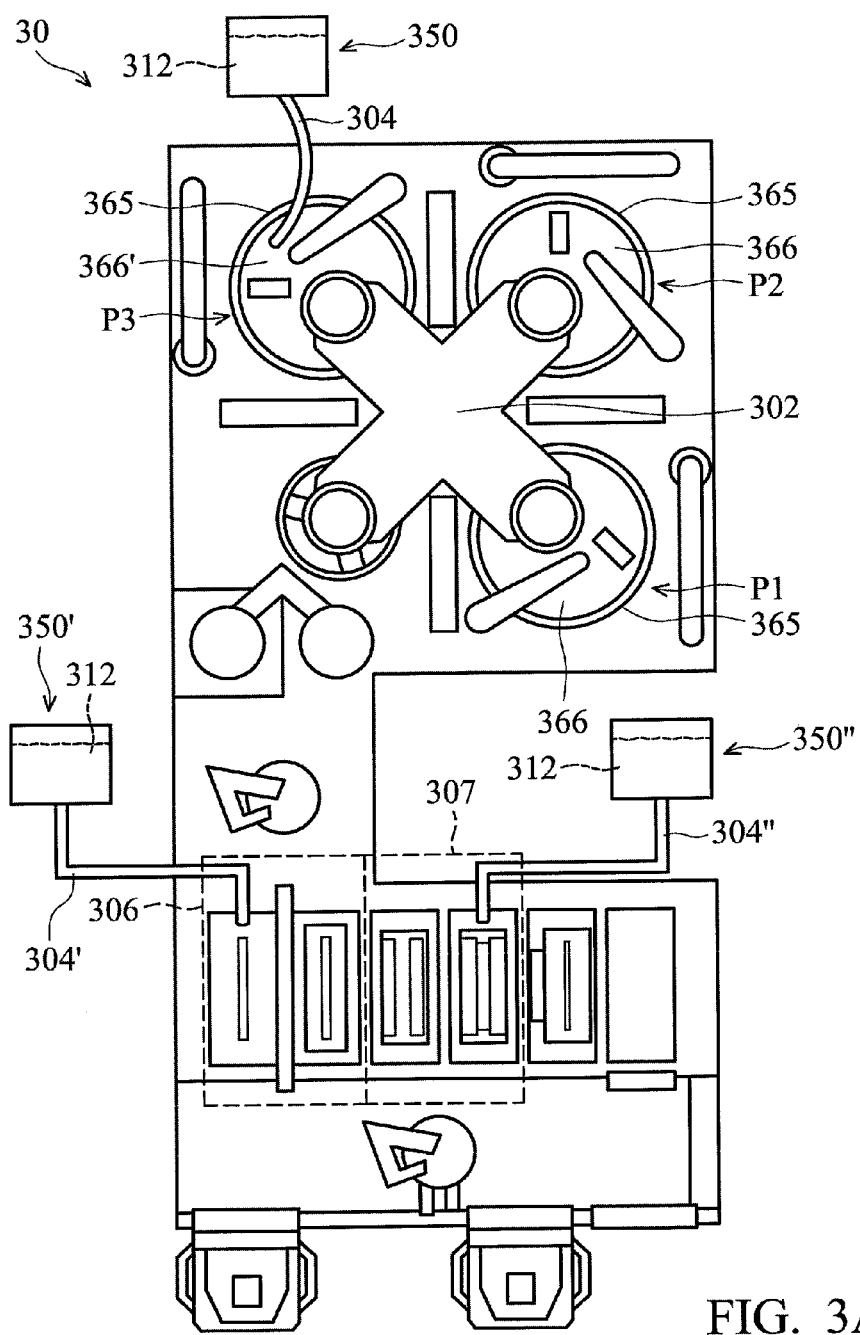
FIG. 3A is an illustrative top view showing a CMP system, in accordance with some embodiments.

FIG. 3A is an illustrative top view showing a CMP rotary polishing system 30, in accordance with some embodiments. The CMP rotary polishing system 30 includes a robot assembly 302 that may be used to transfer a substrate, such as a semiconductor wafer, between polishing stations P1, P2, and P3 where rotatable platens 365 are set. Polishing pads 366 and 366' may be mounted on the rotatable platens 365 in the polishing stations P1, P2, and P3 for polishing. The CMP process may include a main CMP polishing operation and a post CMP cleaning operation. The polishing stations P1 and P2 may be used for performing the main CMP polishing operation. The polishing pads 366 used for the main CMP polishing in the polishing stations P1 and P2 may be hard polishing pads. The robot assembly 302 may include wafer carriers which are adapted to hold wafers to engage the surfaces of the wafers with the polishing pads 366 or 366' mounted on the rotatable platens 365 and provide downward pressure on the wafers. The wafer carrier may be rotatable. Suppliers, including, for example, nozzles, are used to provide appropriate slurry and/or cleaning solution onto the polishing pads 366 and/or 366' on the rotatable platens 365 in the polishing stations P1, P2, and P3.

Different slurries may be provided to different polishing pads 366 for the polishing of different material layers. The slurry may include small, abrasive particles of special sizes, and shapes, and be suspended in an aqueous solution. The abrasive particles may be roughly as hard as the material layer that is to be polished. Acids or bases may be optionally added to the aqueous solution, depending on the material to be polished. The polishing rate may be affected by various parameters, such as the downward pressure on the wafer, rotational speeds of the rotatable platen and the wafer carrier, the chemical composition of the slurry, the concentration of the solid particles in the slurry, the temperature of the slurry, and the shape, size, and distribution of the abrasive particles.

The CMP rotary polishing system 30 also includes cleaning systems used for performing the post CMP cleaning operation to remove residues formed after the main CMP polishing operation. For example, the rotatable platen 365 in the polishing station P3 is used for performing a buffing clean operation (buffing polishing operation). The buffing clean operation is a soft polishing operation performed by using the polishing pad 366', which is a soft buffing pad mounted on the rotatable platen 365 in the polishing station P3. The buffing clean operation is used to remove unwanted particles and/or residues formed during the main CMP polishing operation. A cleaning solution may be provided to improve the cleaning process. The wafer may be further transported to a megasonic clean station 306 and/or a brush clean station 307 to further clean the wafer.

In some embodiments, the wet oxidation process 199 of the exposed gate stack and/or the metal oxide layer 123 mentioned above (see FIG. 1E) is in-situ performed with the CMP process. The wet oxidation process 199 is performed in conjunction with the post CMP cleaning operation. Referring to FIGS. 1C-1D and 3A, the semiconductor substrate 100 shown in FIG. 1C may be sent into the CMP rotary polishing system 30 for performing the main CMP polishing operation (in, for example, the polishing stations P1 and P2) to remove the gate electrode layer 122 and the work function metal layer 120 outside of the opening 107.

After the gate electrode layer 122 and the work function metal layer 120 outside of the opening 107 are removed to form the gate electrode layer 122 shown in FIG. 1D, the semiconductor substrate 100 may further be sent on the polishing pad 366' in the polishing station P3. The buffing clean operation is then performed to clean the exposed surfaces of the insulating layer 116, the contact etch stop layer 114, the work function metal layer 120, and the metal oxide layer 123.

During the buffing clean operation, the oxidizing solution may also be applied onto the polishing pad 366' on the rotatable platen 365 in the polishing station P3. Thus, the buffing clean operation and the wet oxidation process 199 for forming the dense metal oxide layer 123' may be simultaneously and in-situ performed (see FIGS. 3A and 1E). In some embodiments, the oxidizing solution is applied on the polishing pad 366' at the start of the buffing clean operation. In some other embodiments, the oxidizing solution is applied in-situ on the polishing pad 366' after the buffing clean operation is finished or performed for a while. The operation time of the wet oxidation process 199 may be in a range from about 5 seconds to about 2 minutes.

For example, a container 350 carrying an oxidizing solution 312 containing the oxidizing agent is applied through a supplier 304. In some embodiments, the oxidizing solution 312 may be provided onto the polishing pad 366' together with the cleaning solution used in the buffing clean operation. Alternatively, the oxidizing solution 312 and the cleaning solution may be provided through different suppliers.

During the buffing clean operation, the metal oxide layer 123, an upper portion of the gate electrode layer 122, metal residues, an upper portion of the work function metal layer 120, organic residues, metal containing residues, the like, and/or combinations thereof may be further oxidized to form the dense metal oxide layer 123' or be removed. In other words, the dense metal oxide layer 123' is in-situ formed during the buffing clean operation without being transported to another process system. The quality of the formed dense metal oxide layer 123' may be maintained while any negative effect might occur during transportation is prevented. The adhesion between the dense metal oxide layer 123' and the stop layer 124 may be improved (see FIG. 1F).

The oxidizing solution 312 may also be applied on the gate electrode layer 122 and the work function metal layer 120 during the megasonic clean operation and/or the brush clean operation. Containers 350' and 350" carrying the oxidizing solution 312 may be connected to the megasonic clean station 306 and the brush clean station 307 through suppliers 304' and 304", respectively. In some embodiments, some or all of the suppliers 304, 304' and 304" are connected to the same container.

The megasonic clean operation includes using a mechanical agitation generator for agitating the semiconductor substrate 100 in a cleaning solution, such as deionized water (DI water), other applicable solution, or the like, to enhance the cleaning process. The mechanical agitation generator may provide an agitation frequency in a range from about 1 MHz to about 1000 MHz. The operation time of the megasonic clean operation and the wet oxidation process 199 may be in a range from about 5 seconds to about 2 minutes. In some embodiments, the oxidizing solution 312 is mixed with the cleaning solution such that the wet oxidation process 199 for forming the dense metal oxide layer 123' and the megasonic clean operation are simultaneously and in-situ performed. The agitation energy provided by the mechanical agitation generator may facilitate the formation of the dense metal oxide layer 123'. In other words, the combined effects of the wet oxidation process and megasonic clean operation may enhance the oxidation of the exposed surface of the gate stack to form the dense metal oxide layer 123'. Thus, the quality of the metal oxide layer 123' may be further improved. Alternatively, during the brush clean operation, a cleaning solution may also be used. The oxidizing solution 312 may be simultaneously or sequentially used.

The oxidizing solution 312 may be applied on the exposed metal surface of the gate stack, which includes the surfaces of the gate electrode layer 122 and the work function metal layer 120, at least during one of the buffing clean operation, the megasonic clean operation, and the brush clean operation. Alternatively, all or some of the clean operations may be performed in conjunction with the wet oxidation process 199 to clean the surface of the semiconductor substrate 100 as well as to form the dense metal oxide layer 123' on the gate stack. In some other embodiments, the temperature of the oxidizing solution 312 is increased to enhance the wet oxidation process 199. Thus, the temperature of the oxidizing solution 312 used in the buffing clean operation, the megasonic clean operation, and/or the brush clean operation may be increased. For example, the temperature of the oxidizing solution 312 may be increased to be in a range from about 20° C. to about 90° C.

Because the wet oxidation process 199 can be performed together with the post CMP cleaning operation including the buffing clean operation, the megasonic clean operation, and/or the brush clean operation, almost no additional equipment is needed for forming the dense metal oxide layer 123'. Almost no additional fabrication cost and fabrication time is added. Since the dense metal oxide layer 123' is in-situ formed during the CMP process, the quality of the dense metal oxide layer 123' is improved. In some embodiments, the slurry and/or the cleaning solution used during the CMP process includes few or no compounds capable of removing the dense metal oxide layer 123'. For example, no hydrogen fluoride (HF) solution or very dilute HF solution is used.

It should be appreciated that the wet oxidation process 199 for forming the dense metal oxide layer 123' is not limited to be performed in conjunction with the CMP process. In some other embodiments, the oxidizing solution 312 is applied ex-situ on the exposed gate stack in a process system different from the CMP rotary polishing system 30, such as in a separate equipment.

Figure 3B:
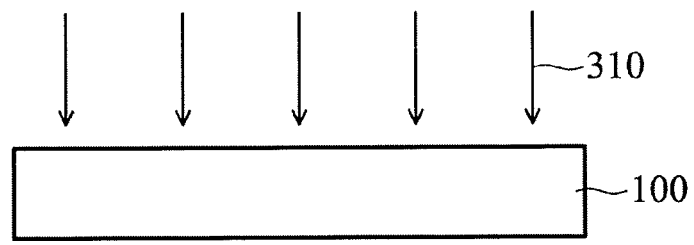
FIGS. 3B and 3C are cross-sectional views each showing the operation of applying an oxidizing solution containing an oxidizing agent on a semiconductor substrate, in accordance with some embodiments.
Figure 3C:
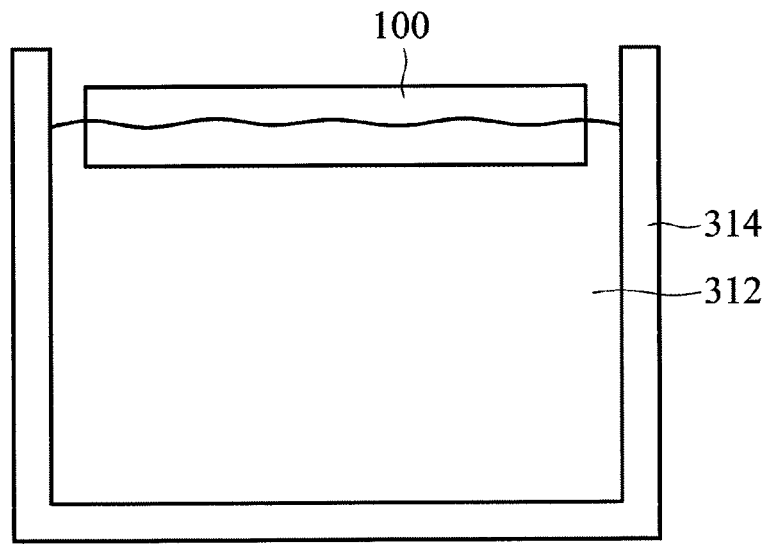

FIG. 3B is a cross-sectional view showing the operation of applying an oxidizing solution containing an oxidizing agent onto a metal gate electrode, in accordance with some embodiments. A spraying or dropping process 310 may be performed to apply the oxidizing solution onto the semiconductor substrate 100 to form the dense metal oxide layer 123' on the gate stack. FIG. 3C is a cross-sectional view showing the operation of applying an oxidizing solution onto the semiconductor substrate 100, in accordance with some other embodiments. The semiconductor substrate 100 may be dipped into the oxidizing solution 312 in a tank 314 to form the dense metal oxide layer 123' on the gate stack. The semiconductor substrate 100 may not be completely dipped into the oxidizing solution 312.

In the embodiments shown in FIGS. 3B and 3C, the oxidizing solution is ex-situ applied on gate stack to form the dense metal oxide layer 123'. Different from the embodiments where the oxygen plasma process or annealing process in oxygen containing gas are used, the dense metal oxide layer 123' formed by using the oxidizing solution is thin. For example, the thickness of the dense metal oxide layer 123' is in the same thickness range of the metal oxide layer 123. Thus, the subsequent process for forming the gate contact connecting the gate electrode layer 122 requires no heavy etching process.

Figure 4A:
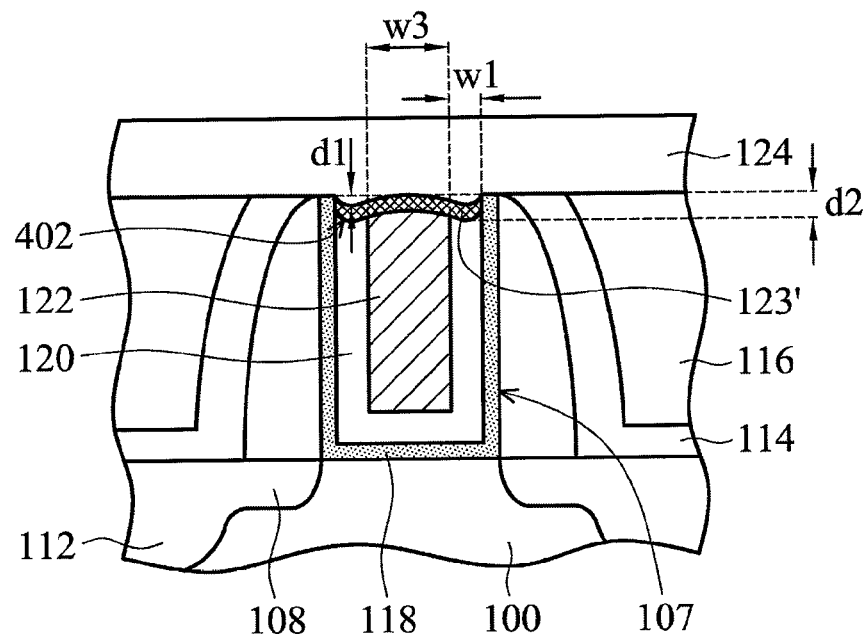
FIGS. 4A and 4B are cross-sectional views each showing a semiconductor device, in accordance with some embodiments.
Figure 4B:
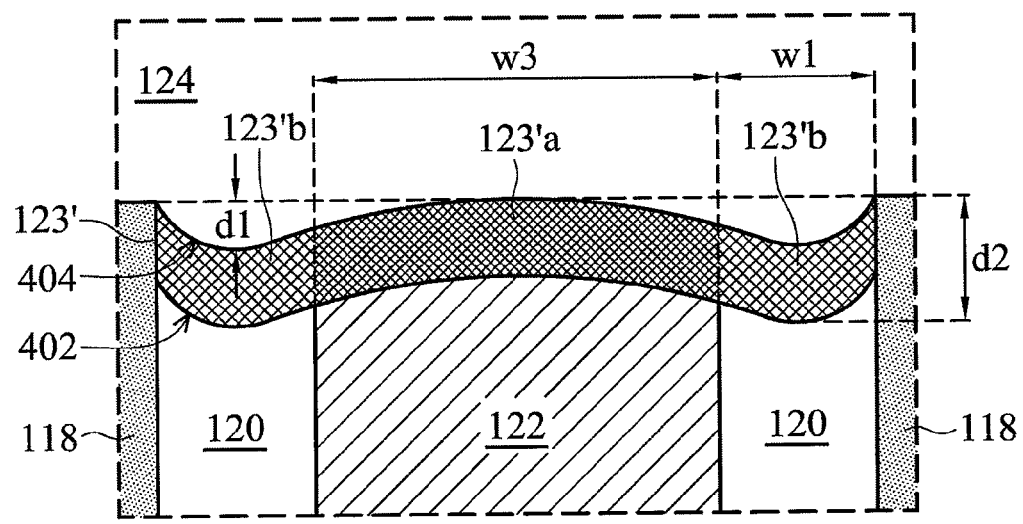

Embodiments of the disclosure have many variations. FIG. 4A shows an enlarged cross-sectional view of the structure shown in FIG. 1G, in accordance with some embodiments. It should be noted that FIG. 4A merely shows the enlarged cross-sectional view of some embodiments. The enlarged cross-sectional view could be different. FIG. 4B is a further enlarged view showing a portion of the structure shown in FIG. 4A, in accordance with some embodiments.

As described above, the work function metal layer 120 is formed between the gate electrode layer 122 and the gate dielectric layer 118. The work function metal layer 120 encircles the gate electrode layer 122. The work function metal layer 120 has a top surface which is about the same height of the top surface of the gate electrode layer 122. In some embodiments, the work function metal layer 120 is also exposed to the oxidizing solution and oxidized to become a part of the dense metal oxide layer 123'. In some embodiments, the dense metal oxide layer 123' formed has a W-shaped cross-sectional view, as shown in FIG. 4A.

It could be due to the oxidizing solution oxidizing the work function metal layer 120 at a faster rate than the gate electrode layer 122. Thus, an indent 402 may be formed on the work function metal layer 120 after the work function metal layer 120 is oxidized to form the dense metal oxide layer 123' on the work function metal layer 120, as shown in FIGS. 4A and 4B. The reason why the dense metal oxide layer 123' has a W-shaped cross-sectional view is proposed above. However, without wishing to be bound by any particular scientific theory, the W-shaped cross-sectional view of the dense metal oxide layer 123' may be created due to other reasons. It should also be appreciated that, in some other embodiments, the dense metal oxide layer 123' formed has a cross-sectional view of a shape other than the W-shape.

The dense metal oxide layer 123' may have a first portion 123'$a$ made of an oxidized material of the gate electrode layer 122 and have a second portion 123'$b$ made of a material which is different from that of the first portion. In some embodiments, the first portion 123'$a$ of the dense metal oxide layer 123' is formed over the gate electrode layer 122. If the gate electrode layer 122 is an aluminum gate electrode, the first portion of the dense metal oxide layer 123' is made of aluminum oxide.

In some embodiments, the second portion 123'$b$ of the dense metal oxide layer 123' is formed over the work function metal layer 120. The second portion 123'$b$ of the dense metal oxide layer 123' may be made of an oxidized material of the work function metal layer 120. Since the materials of the work function metal layer 120 and the gate electrode layer 122 are different, the materials of the second portion 123'$b$ and the first portion 123'$a$ of the dense metal oxide layer 123' are different from each other.

As shown in FIGS. 4A and 4B, the dense metal oxide layer 123' is conformally formed over the top surface of the gate electrode layer 122 and a sidewall of the indent 402. Thus, the second portion 123'$b$ of the dense metal oxide layer 123' on the work function metal layer 120 may extend in the indent 402 and be lower than the first portion 123'$a$ on the gate electrode layer 122. A distance d2 between a bottom of the indent 402 and a top surface of the dense metal oxide layer 123' may be in a range from about 30 Å to about 80 Å. A thickness w1 of the work function metal layer 120 may be in a range from about 20 Å to about 40 Å. The thickness w1 of the work function metal layer 120 may be similar to a width of the indent 402. Thus, an aspect ratio of the indent 402 is about equal to a ratio between the width w1 of the work function metal layer 120 and the distance d2. The aspect ratio of the indent 402 may be in a range from about 1 to about 4.

The stop layer 124 may extend into a recess 404 to be in direct contact with the dense metal oxide layer 123'. A distance d1 of the stop layer 124 extending into the indent 402 may be in a range from about 15 Å to about 40 Å. Thus, an aspect ratio of the recess 404, to be filled with the stop layer 124, is roughly equal to w1/d1. The aspect ratio of the recess 404 is in a range from about 0.5 to about 2. The aspect ratio of the recess 404 is not too high for the stop layer 124 to completely fill the recess 404 (and the indent 402) and directly contact with the dense metal oxide layer 123'. Thus, the adhesion between the stop layer 124 and the dense metal oxide layer 123' is improved.

In some other embodiments, the width w3 of the gate electrode layer 122 is reduced. Even though, the thickness w1 of the work function metal layer 120 may still remain in the same thickness range to provide appropriate work function. Thus, the aspect ratio of the recess 404, to be filled with the stop layer 124, is still in the same aspect ratio range. The stop layer 124 may completely fill the indent 402 and directly contact with the dense metal oxide layer 123'. Thus, the adhesion between the stop layer 124 and the dense metal oxide layer 123' (and the neighboring layers) is also good for the gate electrode layer 122 having a smaller size.

The embodiments of mechanisms for forming a semiconductor device described above form a dense metal oxide layer. The dense metal oxide layer improves adhesion between a dielectric layer and various layers near and surrounding a metal gate electrode. The dense metal oxide layer is formed by a wet oxidation process, which can be done in-situ in a CMP process or ex-situ in a separate system. Due to the good adhesion between the dielectric layer and the dense metal oxide layer, the metal gate electrode is prevented from being damaged or removed during subsequent process steps. As a result, the process yield is thus greatly improved.

In accordance with some embodiments, a semiconductor device is provided. The semiconductor device includes a semiconductor substrate with a metal gate stack formed on the semiconductor substrate, and the metal gate stack includes a metal gate electrode. The semiconductor device also includes a metal oxide layer formed over the metal gate stack and in direct contact with the metal gate electrode, and a thickness of the metal oxide layer is in a range from about 15 Å to about 40 Å. The metal oxide layer has a first portion made of an oxidized material of the metal gate electrode and has a second portion made of a material different from that of the first portion.

In accordance with some embodiments, a semiconductor device is provided. The semiconductor device includes a semiconductor substrate with a metal gate stack formed on the semiconductor substrate, and the metal gate stack includes a metal gate electrode. The semiconductor device also includes a metal oxide layer formed on the metal gate electrode, and a cross-sectional view of the metal oxide layer is W-shaped. The metal oxide layer has a first portion and a second portion, and the second portion extends into an indent surrounding the first portion.

In accordance with some embodiments, a method for forming a semiconductor device is provided. The method includes providing a semiconductor substrate and forming a metal gate stack including a metal gate electrode over the semiconductor substrate. The method also includes applying an oxidizing solution containing an oxidizing agent over the metal gate electrode to oxidize the metal gate electrode to form a metal oxide layer on the metal gate electrode.

Although the embodiments and their advantages have been described in detail, it should be understood that various changes, substitutions, and alterations can be made herein without departing from the spirit and scope of the embodiments as defined by the appended claims. Moreover, the scope of the present application is not intended to be limited to the particular embodiments of the process, machine, manufacture, composition of matter, means, methods, and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A method for forming a semiconductor device, comprising:
   providing a semiconductor substrate;
   forming a metal gate stack comprising a metal gate electrode over the semiconductor substrate; and
   applying an oxidizing solution containing an oxidizing agent over the metal gate electrode during a post CMP cleaning operation to oxidize the metal gate electrode to form a metal oxide layer on the metal gate electrode, wherein the oxidizing solution is different from a cleaning solution of the post CMP cleaning operation.

2. The method for forming the semiconductor device as claimed in claim 1, wherein the oxidizing agent is made of $H_2O_2$, HClO, $NH_2OH$, $KFe(CN)_6$, $Fe(NO_3)_3$, $KIO_3$, HIO3, ClO2, or combinations thereof.

3. The method for forming the semiconductor device as claimed in claim 1, further comprising forming a dielectric layer on the metal oxide layer to directly contact with an entire top surface of the metal oxide layer.

4. The method for forming the semiconductor device as claimed in claim 1, wherein the step of forming the gate stack comprises performing a main chemical mechanical polishing (CMP) operation to a metal layer over the semiconductor substrate to form the metal gate electrode, the post CMP cleaning operation is performed to the metal gate electrode, and the oxidizing solution is in-situ applied during the post CMP cleaning operation.

5. The method for forming the semiconductor device as claimed in claim 4, wherein the post CMP cleaning operation comprises a buffing clean operation, a megasonic clean operation, a brush clean operation, or combinations thereof, and the oxidizing solution is applied on the metal gate electrode at least during one of the buffing clean operation, the megasonic clean operation, and the brush clean operation.

6. The method for forming the semiconductor device as claimed in claim 1, further comprising forming a metal silicide region on a doped region in the semiconductor substrate, wherein the metal silicide region is formed after the metal gate stack and the metal oxide layer are formed.

7. The method for forming the semiconductor device as claimed in claim 1, wherein the oxidizing solution is applied over the metal gate electrode using a spraying process or a dropping process.

8. The method for forming the semiconductor device as claimed in claim 1, wherein the oxidizing solution is applied over the metal gate electrode by dipping the metal gate electrode into the oxidizing solution.

9. The method for forming the semiconductor device as claimed in claim 1, wherein the metal gate stack further comprises a work function layer encircling the metal gate electrode.

10. The method for forming the semiconductor device as claimed in claim 9, wherein the oxidizing solution is also applied over the work function layer to oxidize the work function layer.

11. A method for forming a semiconductor device, comprising:
    providing a semiconductor substrate;
    forming a metal gate stack over the semiconductor substrate, wherein the metal gate stack comprises a metal gate electrode and a work function metal layer surrounding the gate electrode; and
    applying an oxidizing solution over the metal gate electrode and the work function metal layer during a post CMP cleaning operation to oxidize the metal gate electrode and the work function metal layer to form a metal oxide layer on the metal gate electrode and the work function metal layer, wherein the oxidizing solution is different from a cleaning solution of the post CMP cleaning operation.

12. The method for forming the semiconductor device as claimed in claim 11, wherein the oxidizing solution comprises an oxidizing agent made of $H_2O_2$, HClO, $NH_2OH$, $KFe(CN)_6$, $Fe(NO_3)_3$, $KIO_3$, HIO3, ClO2, or combinations thereof.

13. The method for forming the semiconductor device as claimed in claim 11, wherein the post CMP cleaning operation comprises a buffing clean operation, a megasonic clean operation, a brush clean operation, or combinations thereof, and the oxidizing solution is applied on the metal gate electrode and the work function metal layer at least during one of the buffing clean operation, the megasonic clean operation, and the brush clean operation.

14. The method for forming the semiconductor device as claimed in claim 11, wherein the oxidizing solution is applied over the metal gate electrode and the work function metal layer using a spraying process or a dropping process.

15. The method for forming the semiconductor device as claimed in claim 11, wherein the oxidizing solution is applied over the metal gate electrode and the work function metal layer by dipping the metal gate electrode and the work function metal layer into the oxidizing solution.

16. A method for forming a semiconductor device, comprising:
    providing a semiconductor substrate;

forming a metal gate stack over the semiconductor substrate, wherein the metal gate stack comprises a metal gate electrode; and applying an oxidizing solution over the metal gate electrode to oxidize the metal gate electrode to form a metal oxide layer on the metal gate electrode, wherein a cross-sectional view of the metal oxide layer is W-shaped.

17. The method for forming the semiconductor device as claimed in claim 16, wherein the oxidizing solution comprises an oxidizing agent made of $H_2O_2$, HClO, $NH_2OH$, $KFe(CN)_6$, $Fe(NO_3)_3$, $KIO_3$, HIO3, ClO2, or combinations thereof.

18. The method for forming the semiconductor device as claimed in claim 16, wherein the oxidizing solution is applied over the metal gate electrode during a post CMP cleaning operation.

19. The method for forming the semiconductor device as claimed in claim 16, wherein the oxidizing solution is applied over the metal gate electrode using a spraying process or a dropping process.

20. The method for forming the semiconductor device as claimed in claim 16, wherein the oxidizing solution is applied over the metal gate electrode by dipping the metal gate electrode into the oxidizing solution.

* * * * *